imura

[19] United States Patent
[11] 4,259,644
[45] Mar. 31, 1981

[54] LOCAL OSCILLATOR FOR MULTI-BAND RECEPTION HAVING SINGLE CRYSTAL REFERENCE OSCILLATOR

[75] Inventor: Takashi Iimura, Tokyo, Japan
[73] Assignee: Trio Kabushiki Kaisha, Tokyo, Japan
[21] Appl. No.: 7,604
[22] Filed: Jan. 29, 1979
[51] Int. Cl.$^3$ .......................... H03L 7/16; H04B 1/26
[52] U.S. Cl. .......................................... 331/2; 331/22; 331/25; 455/260
[58] Field of Search ........................ 331/17, 18, 25, 30, 331/31, 22, 2, 16; 455/260, 316

[56] References Cited
U.S. PATENT DOCUMENTS

| | | | |
|---|---|---|---|
| 4,095,190 | 6/1978 | Imazeki et al. | 331/31 X |
| 4,137,508 | 1/1979 | Hugenholtz | 331/31 X |
| 4,152,669 | 5/1979 | Igarashi | 331/17 X |
| 4,198,604 | 4/1980 | Holdaway | 331/22 X |

Primary Examiner—Siegfried H. Grimm
Assistant Examiner—Edward P. Westin
Attorney, Agent, or Firm—Gerald J. Ferguson, Jr.; Joseph J. Baker

[57] ABSTRACT

A local oscillator having a variable frequency oscillator and a carrier frequency oscillator for use in communication systems that transmit and/or receive signals on multiple frequency bands, one crystal reference oscillator; a converter circuit for mixing the outputs of at least the variable frequency oscillator and the carrier frequency oscillator to produce an output having a frequency corresponding to the receiving frequency and a phase-locked loop circuit including a plurality of voltage control oscillators corresponding to the number of receiving frequency bands; a mixing circuit for mixing the output of a predetermined one of the voltage control oscillators corresponding to a predetermined one of the frequency bands with the output of the converter circuit to produce an output of fixed frequency corresponding to the one frequency band; a programmable counter that divides the output of the mixing circuit in accordance with a frequency dividing ratio corresponding to the one frequency band; and a phase comparator for comparing the phase of the output signal from the programmable counter with that of the output from the one crystal reference oscillator to provide a control signal for the one voltage control oscillator whereby the one crystal reference oscillator may be employed with all of the voltage control oscillators.

9 Claims, 2 Drawing Figures

LOCAL OSCILLATOR FOR MULTI-BAND RECEPTION HAVING SINGLE CRYSTAL REFERENCE OSCILLATOR

BACKGROUND OF THE INVENTION

1. Field of the Invention

This invention relates to a local oscillator for use in communication systems that transmit and/or receive signals on multiple frequency bands and, in particular, it relates to such a local oscillator that uses a phase-locked loop (PLL hereinafter) circuit.

2. Discussion of the Prior Art

An illustrative, conventional local oscillator is shown in FIG. 1, the receiving side of an SSB transceiver being employed as an example. In FIG. 1, 1 is an antenna, 2 is a high frequency amplifier circuit, 3 is a mixing circuit, 4 is an intermediate frequency filter, 5 is an intermediate frequency amplifier circuit, 6 is a demodulation circuit, 7 is a local oscillator and 8 is a receiving frequency counter unit. These elements comprise the receiving unit of an SSB transceiver that receives signals on multiple frequency bands.

Local oscillator 7 consists of a PLL circuit which has two mixing circuits in a loop comprising a plurality of voltage control oscillators (VCO hereinafter) 9 equal to the number of the receiving frequency bands, two mixing circuits 10 and 11, a low-pass filter 12, a band-pass filter 13, a phase comparator 14, a loop filter 15 and a plurality of heterodyne crystal oscillators 16 equal to the number of VCOs 9.

Mixing circuit 10 mixes the output signal of the VCO 9 selected from the plurality of VCOs 9 corresponding to the receiving frequency band with the output signal of the heterodyne crystal oscillator 16 selected from the plurality of heterodyne crystal oscillators 16 corresponding to the receiving frequency to produce a signal having a frequency of a certain fixed range. The mixing circuit 11 mixes the output signal of mixing circuit 10 after it is passed by low-pass filter 12 with the output signal of a carrier frequency oscillator 17. Phase comparator 14 compares the phase of the output of mixing circuit 11 after it is passed by band-pass filter 13 with that of the output signal from a variable frequency oscillator (VFO hereinafter) 18, the output frequency of which is the reference frequency. The output from comparator 14 controls VCO 9 to produce the output of local oscillator 7.

Counter unit 8 comprises a mixing circuit 19 that mixes the output of VCO 9 with the output of carrier frequency oscillator 17, a counter 21 that receives the output of mixing circuit 19 and the output of a reference frequency oscillator 20, and an indicator 22 that displays the output of counter 21. Thus, unit 8 displays the receiving frequency.

However, in the case of a conventional local oscillator such as described above, there is a shortcoming in that the number of the heterodyne crystal oscillators has to equal the number of the receiving frequency bands.

Another shortcoming is that an error in the output frequency of a heterodyne crystal oscillator appears in the output causing the output frequency of the local oscillator to shift when the receiving frequency band is switched.

When the respective output frequencies of carrier frequency oscillator 17, VCO 9, heterodyne crystal oscillator 16, and VFO 18 are denoted as $f_{CAR}$, $f_{VCO}$, $f_{HET}$, and $f_{VFO}$, and the receiving frequency as $f_{SIG}$, $$f_{VCO} = f_{HET} + f_{CAR} - f_{VFO},$$

$$f_{SIG} = f_{VCO} - f_{CAR}, \text{ and}$$

$$f_{SIG} = f_{HET} - f_{VFO}$$

results. The receiving frequency can be indicated as the difference between the output frequency of heterodyne crystal oscillator 16 and the output frequency of VFO 18. However, in order to calibrate individual signals of the multiple crystal oscillators 16 into accurate oscillation frequencies, an enormous amount of labor is required resulting in high cost. Therefore, avoiding this method, the receiving frequency is indicated as the difference between the output frequency of VCO 9 and the output frequency of carrier frequency oscillator 17. Consequently, another shortcoming involves the complex construction of the counter unit.

In addition, because of the large number of the heterodyne crystal oscillators and the complex construction of the counter unit, another shortcoming is that the overall size increases making the product expensive.

SUMMARY OF THE INVENTION

This invention was made in view of the above-mentioned problems, and the object is to produce a local oscillator that eliminates the above shortcomings whereby the number of heterodyne crystal oscillators can be reduced to one and the counter unit for receiver frequency display can be simplified.

Other objects and advantages of this invention will be apparent from a reading of the following specification and claims taken with the drawing.

DETAILED DESCRIPTION OF THE PREFERRED EMBODIMENT OF THE INVENTION

Figure 1:
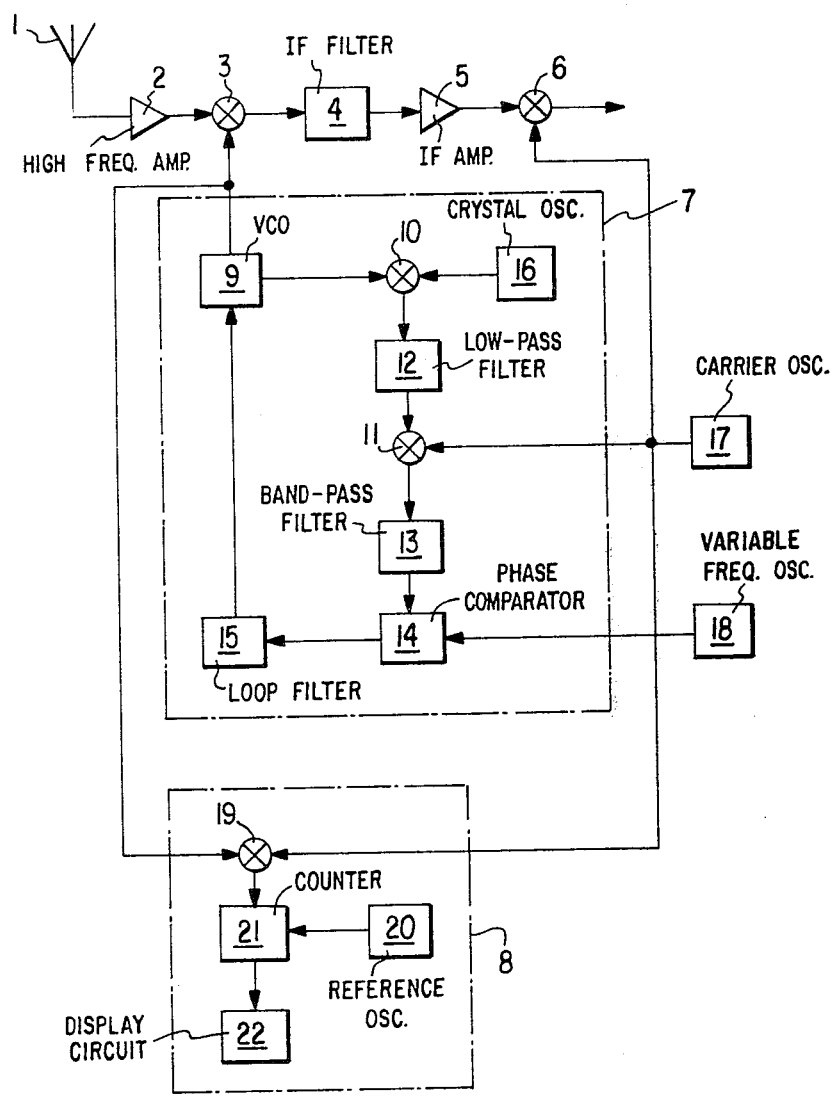
FIG. 1 is a block diagram of an illustrative receiving unit of an SSB transceiver using a conventional local oscillator.
Figure 2:
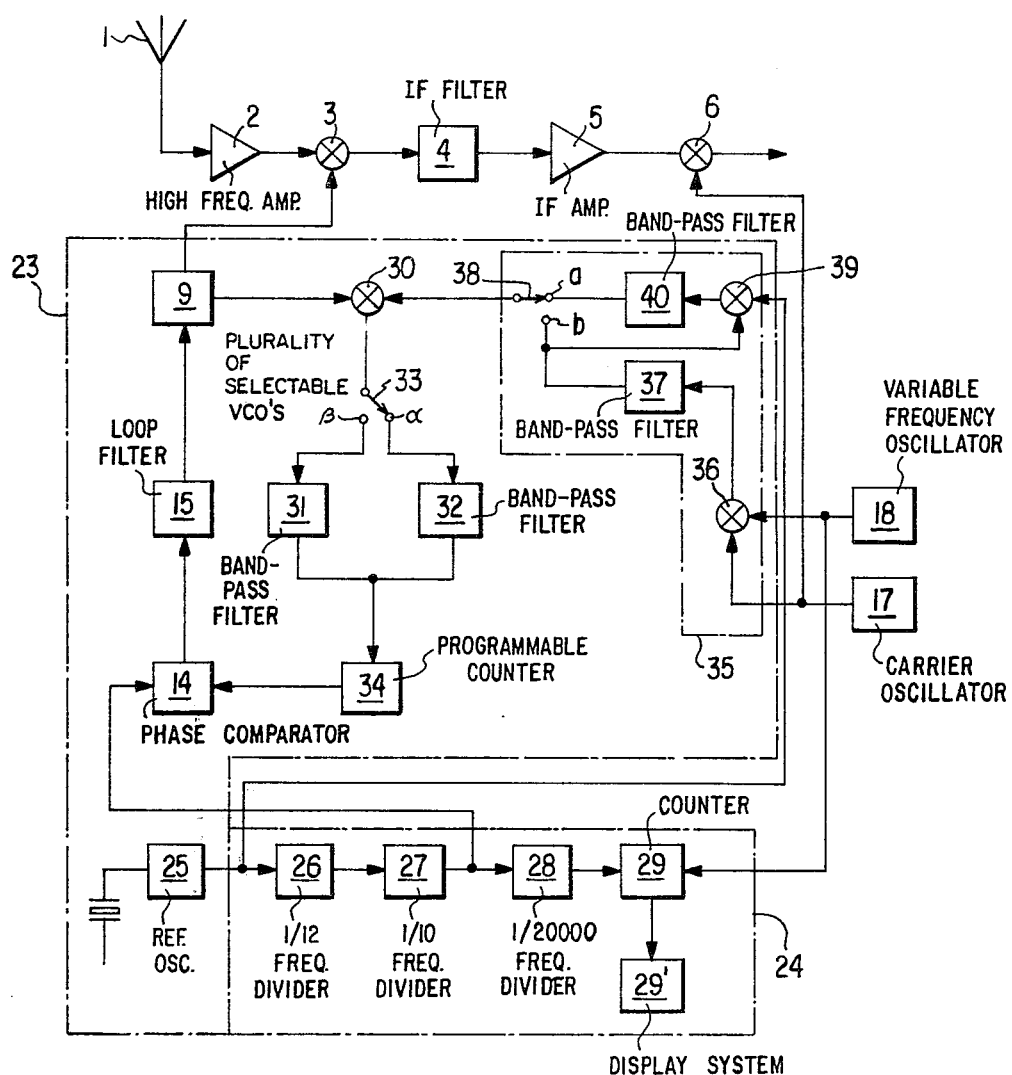
FIG. 2 is a block diagram of an illustrative receiving unit of an SSB transceiver using an illustrative local oscillator in accordance with this invention.

In FIG. 2, the components the same as those in FIG. 1 are labelled with the same reference numerals. 1 is an antenna, 2 is a high frequency amplifier circuit, 3 is a mixing circuit, 4 is an intermediate frequency filter, 5 is an intermediate amplifier circuit, 6 is a demodulation circuit, 23 is a local oscillator, 17 is a carrier frequency oscillator, 18 is a VFO, and 24 is a receiving frequency counter unit. The foregoing elements comprise an illustrative receiver unit of an SSB transceiver that receives signals on multiple frequency bands.

Local oscillator 23 comprises a PLL circuit and a converter circuit 35. The PLL circuit consists of a plurality of VCO's 9 that equal the number of the receiving frequency bands; a first mixing circuit 30 that mixes the output of converter circuit 35 with the output of VCO 9; a first change-over switch 33 that selects either a first or a second band-pass filter 31 or 32, according to the frequency of first mixing circuit 30 where first band-pass filter 31, which has a band width ranging from 1.5 MHz to 4 MHz, receives the output of first mixing circuit 30 from a contact β of change-over switch 33 and second band-pass filter 32 which has a band width ranging from 10 MHz to 13 MHz, receives the output of the first mixing circuit from a contact α of change-over switch 33; a programmable counter 34 that receives the output of either first or second band-pass filters 31 or 32; a crystal reference oscillator 25 that oscillates at the frequency of 12 MHz; a phase comparator 14 that compares the phase of the output of programmable counter 34 with that of the 1/120 output of the crystal reference oscillator as the reference frequency, and a loop filter 15 that receives the output of phase comparator 14 and applies it to VCO 9.

Converter circuit 35 comprises a second mixing circuit 36 that mixes the output signal of carrier frequency oscillator 17 with the output signal of VFO 18; a third band-pass filter 37 having a band width ranging 14–14.5 MHz that outputs a signal to contact b of a second change-over switch 38 using the output of second mixing circuit 36 as its input; a third mixing circuit 39 that mixes the output of third band-pass filter 37 with the output of crystal reference oscillator 25; a fourth band-pass filter 40 having a band width ranging 26–26.5 MHz that outputs a signal to contact a of second change-over switch 38 following reception of the output of third mixing circuit 39 where second change-over switch 38 passes the output of either third or fourth band-pass filters 37 or 40 to first mixing circuit 30.

Receiving frequency counter unit 24 comprises a frequency divider portion comprising cascade-connected frequency dividers 26, 27 and 28 having dividing ratios of 1/12, 1/10, and 1/20,000 respectively that divide the output of crystal reference oscillator 25; a counter 29 that accepts the output of frequency divider 28 and the output of VFO 18; and a display unit 29' that displays the output of counter 29.

The output frequencies of carrier frequency oscillator 17 and VFO 18 are 9 MHz and 5–5.5 MHz respectively.

The operation of local oscillator 23 will now be described. As an example, take the case of a 14 MHz amateur radio frequency band receiver. When receiving on the 14 MHz frequency band, a VCO 9 that oscillates at an output frequency of 23.0–23.5 MHz is selected along with contact β of first change-over switch 33, contact a of second change-over switch 38, and the frequency dividing ratio 30 of the programmable counter 34.

The output frequency of VFO 18 is now set to 5.3 MHz. As a result, the output frequency of second mixing circuit 36 becomes 14.3 MHz and is mixed with the 12 MHz output frequency of reference crystal oscillator 25. The output of 26.3 MHz of third mixing circuit 39 is impressed on first mixing circuit 30 through second change-over switch 38 and mixed with the output frequency of VCO 9. When the PLL circuit is in a locked state, the output of first mixing circuit becomes 3 MHz and passes through first band-pass filter 31. Its frequency is divided by 30 at programmable counter 34 to make it 100 kHz, which is the frequency of the output from the programmable counter. The phase of this output is compared by phase comparator 14 to that of the reference frequency of 100 kHz, obtained by dividing the output frequency of 12 MHz of crystal reference oscillator 25 by 120, to thereby cause the output frequency of VCO 9 to be 23.3 MHz. This output frequency of 23.3 MHz is impressed on mixing circuit 3 as the output frequency of local oscillator 23 where the signal is received at a frequency of 14.3 MHz. The intermediate frequency is 9 MHz.

Similarly, when receiving on the 3.5 MHz frequency band, a VCO 9 with an output frequency of 12.5–13.0 MHz is selected along with contact β of first change-over switch 33, contact b of second change-over switch 38 and a frequency dividing ratio of 15 for programmable counter 34.

If the output frequency of VFO 18 is now set at 5.2 MHz, the output of second mixing circuit 36 becomes 14.2 MHz, and the output of third mixing circuit 39 becomes 26.2 MHz. However, since contact b was selected, the output of third band-pass filter 37 at 14.2 MHz is outputted to first mixing circuit 30 and mixed with the output of the VCO 9. When the PLL circuit is in a locked state, the output of first mixing circuit 30 becomes 1.5 MHz, which is divided by programmable counter 34 by 15 to produce 100 kHz. Its phase is then compared to that of the 100 kHz obtained by dividing the output frequency of 12 MHz from the crystal reference oscillator 25 by 120. The output frequency of VCO 9 becomes 12.7 MHz where the signal is received at a frequency of 3.7 MHz.

Other frequency bands work similarly. The output frequency of VCO 9, the contact positions of first change-over switch 33 and second change-over switch 38, the output frequency of first mixing circuit 30, the frequency dividing ratio of programmable counter 34, and the receiving frequency range are respectively summarized below in Table 1.

TABLE 1

| Frequency Band | VCO 9 Output Frequency MHz | Position of Change-Over Switch 33 | Position of Change-Over Switch 38 | Output of First Mixing Circuit 30, MHz | Dividing Ratio of Programmable Counter 34 | Receiving Frequency Range MHz |
|---|---|---|---|---|---|---|
| JJY | 24–24.5 | β | a | 2.0 | 20 | 15.000–15.500 |
| 3.5 | 12.5–13 | β | b | 1.5 | 15 | 3.500–4.000 |
| 7 | 16.0–16.5 | α | a | 10 | 100 | 7.000–7.500 |
| 14 | 23.0–23.5 | β | a | 3.0 | 30 | 14.000–14.500 |
| 21 | 30.0–30.5 | β | a | 4.0 | 40 | 21.000–21.500 |
| 28 | 37.0–39.0 | α | a | 11–12.5 | 110–125 | 28.000–30.000 |

As described above, the local oscillator of this invention comprises a converter circuit that mixes the outputs of at least the VFO and carrier frequency oscillator and outputs a frequency corresponding to the receiving frequency and a PLL circuit that mixes the VCO output switched and selected according to the frequency band used with the output of the converter circuit, divides the resulting frequency by a dividing ratio corresponding to the frequency band used, and performs phase synchronization between the reference frequency from the one crystal reference oscillator and the divided frequency. Consequently, a stable local oscillator frequency can be obtained. Further, it is unnecessary to employ heterodyne crystal oscillators equal in number to the frequency bands; rather only one crystal reference oscillator suffices. Thus, the number of components is reduced as is the size thereby enabling the production of the local oscillator at a lower cost.

In addition, when this local oscillator is used, $f_{SIG}=f_{VFO}\pm N.f_{ref}$ or $f_{SIG}=f_{VFO}\pm N.f_{ref}+f_{STD}$ where $f_{VFO}$ is the output frequency of VFO 18, $f_{STD}$ is the output frequency of crystal reference oscillator 25, $f_{ref}$ is the reference frequency of the PLL circuit, $f_{SIG}$ is the receiving frequency and N is the dividing ratio of programmable counter 34. Thus, the receiving frequency is unrelated to the output frequency of the carrier frequency oscillator and the reference $f_{ref}$ and the output frequency of the crystal reference oscillator $f_{STD}$ are obtained from one crystal reference oscillator. It is easy to calibrate accurately this one crystal reference oscillator where the labor and cost required for it are minimized. Moreover, since the frequency dividing ratio N of programmable counter 34 is fixed corresponding to the receiver frequency band, the receiving frequency can be displayed as shown by the above equations by adding the required offset to the VFO output frequency according to the receiver frequency band. This results in a very simple construction of the counter unit for the receiving frequency, and accurate receiving frequency can be displayed. This is also true with the oscillation frequency. The cost of counter unit 24 for the receiving frequency is also lowered.

In addition, since the receiving frequency is unrelated to the output frequency of the carrier frequency oscillator, the receiving signal can be freely shifted within the zone of the intermediate frequency filter during CW or SSB reception without changing its tone. When interference occurs, the desired signals are shifted within the band of the intermediate frequency filter to place the interfering wave outside of the band by changing the carrier frequency and interference is eliminated.

When, for example, the receiving frequency bands are a bandseries with a certain fixed frequency interval as 7 MHz, 14 MHz, 21 MHz, and 28 MHz, the frequency of the receiving frequency band with the carrier frequency added thereto, that is, $f_{VCO}$ also results in a band series with the above-mentioned fixed frequency intervals. If the frequency of the converter circuit is set to a frequency at the middle of the two center bands of this series, 14 MHz and 21 MHz in the above example, the relationship between the output frequencies of the first mixing circuits in each receiver frequency band is as follows because the respective output frequencies of VCOs are also arranged at a fixed frequency interval as mentioned above: the frequency difference between the maximum frequency band, 28 MHz in the above example, and the output frequency of the converter circuit becomes equal to the frequency difference between the minimum frequency band, 7 MHz in the above example, and the output frequency of the converter circuit. Similarly, the frequency difference between the second highest frequency band, 21 MHz in the above example, and the output frequency of the converter circuit becomes equal to the frequency difference between the second lowest frequency band, 14 MHz in the above example, and the output frequency of the converter circuit. Therefore, the first and the second band-pass filters used for the respective receiver frequency bands of the maximum and the minimum frequency bands can be served by one band-pass filter; and the first and the second band-pass filters used for the respective receiving frequency bands of the second highest frequency band and the second lowest frequency band can also be served by one band-pass filter. Thus, the invention is also effective in reducing the number of band-pass filters to one half.

What is claimed is:

1. In a local oscillator having a variable frequency oscillator and a carrier frequency oscillator for use in communication systems that transmit and/or receive signals on multiple frequency bands, the improvement of one crystal reference oscillator;

converter means for mixing the outputs of at least said variable frequency oscillator and said carrier frequency oscillator to produce an output having a frequency corresponding to the receiving frequency; and a phase-locked loop circuit including a plurality of voltage control oscillators corresponding to the number of receiving frequency bands;

mixing means for mixing the output of a predetermined one of said voltage control oscillators corresponding to a predetermined one of said frequency bands with the output of said converter means to produce an output of fixed frequency corresponding to said one frequency band; and phase comparator means responsive to the phase of the output signal from said mixing means and the phase of the output from said one crystal reference oscillator to provide a control signal for said one voltage control oscillator whereby said one crystal reference oscillator may be employed with all of said plurality of voltage control oscillators.

2. A local oscillator as in claim 1 where said phase-locked loop circuit includes a programmable counter for dividing the output of said mixing means in accordance with a frequency dividing ratio corresponding to said one frequency band and where said phase comparator means is responsive to the phase of the output signal from said programmable counter and that of said output from the one crystal reference oscillator to provide said control voltage.

3. A local oscillator as in claim 1 including a display means responsive to at least the output frequency from said variable frequency oscillator for displaying said receiving frequency.

4. A local oscillator as in claim 3 where said display means includes means for adding an offset to the output frequency of said variable frequency oscillator.

5. A local oscillator as in claim 1 where there is only one crystal reference oscillator.

6. A local oscillator as in claim 1 where said receiving frequency bands are separated from one another by equal frequency intervals and where the frequency of the output from said converter means is at the middle of the two center frequency bands of the plurality of frequency bands.

7. A local oscillator as in claim 1 where said converter means includes further mixing means for mixing the output of said one crystal reference oscillator with the mixed output of said variable frequency oscillator and said carrier frequency oscillator whereby a first output is provided from said converter means to said mixing means corresponding to said mixed output in response to a first one of said frequency bands being selected and a second output is provided from said converter means to said mixing means corresponding to the output of said further mixing means in response to a second one of said frequency bands being selected.

8. A local oscillator as in claim 1 where said phase-locked loop includes at least two pass-band filters responsive to the output of said mixing means and switching means for selectively connecting one of said two pass-band filters to said mixing means to thereby provide the output of the selected pass-band filter to said phase comparator means depending on which one of said frequency bands is selected.

9. A local oscillator as in claim 8 where said converter means includes further mixing means for mixing the output of said one crystal reference oscillator with the mixed output of said variable frequency oscillator and said carrier frequency oscillator whereby a first output is provided from said converter means to said mixing means corresponding to said mixed output in response to a first one of said frequency bands being selected and a second output is provided from said converter means to said mixing means corresponding to the output of said further mixing means in response to a second one of said frequency bands being selected, said first band pass filter being selected in response to the selection of said first frequency band and said second band pass filter being selected in response to the selection of said second frequency band.

* * * * *

UNITED STATES PATENT AND TRADEMARK OFFICE
CERTIFICATE OF CORRECTION

PATENT NO. : 4,259,644
DATED : March 31, 1981
INVENTOR(S) : TAKASHI IIMURA

It is certified that error appears in the above–identified patent and that said Letters Patent are hereby corrected as shown below:

IN THE HEADING OF THE PATENT, PLEASE INSERT THE FOLLOWING:

Foreign Application Priority Data

February 1, 1978    Japan. . . . . . . . . . . 53-10286

Signed and Sealed this

Eleventh Day of August 1981

[SEAL]

Attest:

GERALD J. MOSSINGHOFF

Attesting Officer    Commissioner of Patents and Trademarks